(12) United States Patent
Blümel

(10) Patent No.: US 8,174,036 B2
(45) Date of Patent: May 8, 2012

(54) LIGHTING DEVICE

(75) Inventor: Simon Blümel, Schierling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 825 days.

(21) Appl. No.: 11/022,565

(22) Filed: Dec. 22, 2004

(65) Prior Publication Data

US 2005/0218790 A1 Oct. 6, 2005

(30) Foreign Application Priority Data

Dec. 30, 2003 (DE) .................... 103 61 803

(51) Int. Cl.
*H01L 33/54* (2010.01)
(52) U.S. Cl. ..... 257/98; 313/498; 352/235; 352/311.01; 257/100
(58) Field of Classification Search .................. 313/498, 313/501, 512, 113, 502, 504; 362/326–328, 362/332–335, 338, 311, 84, 800, 97.1, 97.3, 362/97.4, 235, 240, 244, 245, 249.02, 296.05, 362/310, 311.02, 311.06, 329; 257/79–103
See application file for complete search history.

(56) References Cited

U.S. PATENT DOCUMENTS

| | | | | |
|---|---|---|---|---|
| 5,055,892 A * | 10/1991 | Gardner et al. | .................. | 257/99 |
| 5,122,943 A * | 6/1992 | Pugh | .................. | 362/256 |
| 5,613,769 A * | 3/1997 | Parkyn et al. | .................. | 362/338 |
| 5,727,108 A * | 3/1998 | Hed | .................. | 385/133 |
| 5,894,196 A * | 4/1999 | McDermott | .................. | 313/512 |
| 6,096,819 A * | 8/2000 | Poch-Parramon et al. | ... | 524/420 |
| 6,486,543 B1 * | 11/2002 | Sano et al. | .................. | 257/684 |
| 6,496,162 B2 * | 12/2002 | Kawakami et al. | .................. | 345/46 |
| 6,547,423 B2 * | 4/2003 | Marshall et al. | .................. | 362/333 |
| 6,578,989 B2 * | 6/2003 | Osumi et al. | .................. | 362/298 |
| 7,059,728 B2 * | 6/2006 | Alasaarela et al. | .................. | 353/94 |

(Continued)

FOREIGN PATENT DOCUMENTS

EP 0415640 2/1995

(Continued)

OTHER PUBLICATIONS

Miller, W., "The Formula for Curvature," dated Oct. 26, 2007, available online at http://www.ima.umn.edu/~miller/1372curvature.pdf.

(Continued)

*Primary Examiner* — Joseph L Williams
*Assistant Examiner* — Fatima Farokhrooz
(74) *Attorney, Agent, or Firm* — Fish & Richardson P.C.

(57) ABSTRACT

The invention relates to a lighting device comprising a light source (1) that emits incoherent light with a total radiation power P and has a radiation-emitting area (S) divided into a plurality of subareas ($S_i$), wherein assigned to each subarea ($S_i$) is a light ray (2) having a radiation power $P_i$ and the sum of the radiation powers $P_i$ is equal to the total radiation power P, and disposed after said light source (1) is an optical element (4) having a decoupling surface (5) and a total reflection angle ($\theta_c$) assigned to said decoupling surface (5), said decoupling surface (5) being shaped so that at least for a portion of said light rays (2) the angle ($\alpha$) of incidence on said decoupling surface (5) is smaller than the total reflection angle ($\theta_c$), and the radiation power of said light rays collectively is greater than a predetermined fraction, equal to at least 50%, of the total radiation power P.

13 Claims, 3 Drawing Sheets

U.S. PATENT DOCUMENTS

| | | |
|---|---|---|
| 7,465,074 B2 | 12/2008 | Blümel |
| 2002/0159270 A1* | 10/2002 | Lynam et al. .................. 362/492 |
| 2003/0080341 A1* | 5/2003 | Sakano et al. ................... 257/79 |
| 2007/0120135 A1* | 5/2007 | Soules et al. .................... 257/98 |

FOREIGN PATENT DOCUMENTS

| | | | |
|---|---|---|---|
| EP | 1235281 | | 8/2002 |
| EP | 1246265 | | 10/2002 |
| GB | 2206444 | * | 1/1989 |
| JP | 361216491 A | * | 9/1986 |
| JP | 363131586 A | * | 6/1988 |
| JP | 3-97277 | | 4/1991 |
| JP | 07094785 | * | 4/1995 |
| JP | 07094785 A | * | 4/1995 |
| WO | WO 02/19440 | | 3/2002 |

OTHER PUBLICATIONS

Definition of "aspheric" from the Photonics Dictionary (Laurin Publishing, 1996-2009), available online at http://www.photonics.com/Splash.aspx?PageID=6.

English translation of Office Action in Japanese patent application No. 2004-381535, dated Aug. 11, 2010.

* cited by examiner

LIGHTING DEVICE

FIELD OF THE INVENTION

The present invention relates to a lighting device with an optimized decoupling surface.

BACKGROUND OF THE INVENTION

Such lighting devices include a light source and, disposed thereafter, an optical element having a decoupling surface for the light emitted by the light source. For example, the light source can be a semiconductor chip, with a suitably shaped potting compound as the optical element.

For the light emitted by the light source to be decoupled as effectively as possible, the optical element must be adapted to the light source.

With special light sources, particularly coherent light sources such as semiconductor lasers, for example, which have a comparatively well-defined and highly directed radiation characteristic, it is often possible to use prefabricated optical elements/element shapes that have been optimized for this class of light sources, such as lenses for parallelizing or focusing the light.

Incoherent light sources, however—such as LED chips, for example—have a much more complex radiation characteristic that makes it much more difficult to adapt the optical element.

In conventional lighting devices, therefore, the light source is frequently approximated to a point light source and the optical element is shaped so that the desired radiation characteristic is obtained in combination with a point light source. This approximation is often used for LED chips, in particular, due to the comparatively small dimensions of the chip.

With such lighting devices, however, it can happen that a substantial fraction of the light generated does not exit from the intended decoupling surface, but is instead reflected and ultimately absorbed.

These reflection losses are often compensated for by increasing the radiation power of the light source. However, this typically leads to increased energy consumption and higher thermal stresses on the light source. Modifying the chip design to achieve higher radiation powers, as an alternative in the case of LED chips, usually entails considerable expenditure.

BRIEF SUMMARY OF THE INVENTION

It is the object of the present invention to create a lighting device of the aforesaid kind whose efficiency is improved. In particular, according to the invention, more than about half the light generated by the light source is decoupled directly. In direct decoupling, a light ray emitted by a light source exits the assigned decoupling surface forthwith or after reflection by a reflector provided for that purpose, so that, in particular, no total reflection occurs at the decoupling surface.

According to a first embodiment of the invention, provided is a lighting device comprising an incoherent light source that emits light with a total radiation power P and has a light-emitting area S divided into a plurality of subareas $S_i$, wherein assigned to each subarea $S_i$ is a light ray having a radiation power $P_i$, and the sum of the radiation powers $P_i$ is equal to the total radiation power P. Disposed after the light source is an optical element having a decoupling surface shaped so that at least for a portion of the light rays, the angle of incidence on the decoupling surface is smaller than the total reflection angle assigned to the decoupling surface, the radiation power of these light rays collectively being greater than a predetermined fraction q of the total radiation power P that is preferably at least 50%.

The invention is based on the realization that approximating a light source to a point light source is often only conditionally appropriate. In the context of the invention, in contrast to this approximation, the light source is viewed as an extended object having a radiation-emitting area S. This area is divided into a plurality of subareas $S_i$, and assigned to each subarea is a light ray with a radiation power $P_i$. It should be pointed out that this subdivision in no way constitutes subdivision in the physical sense, but is rather the assignment of a plurality of subareas $S_i$ which together yield area S.

The light rays assigned to the subareas each possess a radiation power $P_i$ and an emission direction that can be determined, for example, by experimental analysis of the light source. Alternatively, these parameters can also be obtained via simulation calculations for the light source concerned.

In a second embodiment of the invention, provided is a lighting device comprising a light source that emits incoherent light with a total radiation power P and has a radiation-emitting area S divided into a plurality of subareas $S_i$, wherein assigned to each subarea $S_i$ is a light ray bundle comprising a plurality of light rays of radiation power $P_{ij}$, and the sum of the radiation powers $P_{ij}$ is equal to the total radiation power P. Disposed after the light source is an optical element having a decoupling surface and a total reflection angle $\theta_c$ assigned to said decoupling surface, said decoupling surface being shaped so that at least for a portion of the light rays, the angle $\alpha$ of incidence on the decoupling surface is smaller than the total reflection angle $\theta_c$, and the radiation power of these light rays collectively is greater than a predetermined fraction q of the total radiation power P that is preferably at least 50%.

In this variant, again, the light source is considered to be not a point light source but an extended object having a radiation-emitting area S, and this area is divided into a plurality of subareas $S_i$, with the addition that a bundle of light rays, rather than one light ray, is assigned to a subarea $S_i$. Advantageously, the radiation characteristic of any subarea can thus be considered by choosing the distribution of the radiation powers $P_{ij}$ on the basis of the radiation characteristic. The radiation characteristics of the individual subareas can be determined, for example, by simulation calculations, for instance a ray-tracing method, or they can be measured experimentally.

It should again be noted that this subdivision into subareas does not constitute subdivision in the physical sense, but rather the assignment of a plurality of subareas $S_i$ that together yield area S.

The propagation of the light rays in the optical element results in a point of incidence for each light ray striking the decoupling surface of the optical element. The decoupling surface is shaped according to the invention so that at least for a portion of the light rays, the angle of incidence on the decoupling surface is smaller than the total reflection angle. The angle of incidence and the total reflection angle are referred, here and hereinafter, to the respective surface normal of the decoupling surface at the point of incidence. In the case of an optical element having a refractive index $n_1$ and an adjacent environment having a smaller refractive index $n_2$, the total reflection angle $\theta_c$ is given by $$\theta_c = \arcsin\frac{n_2}{n_1}$$

If the optical element and/or and the environment are optically inhomogeneous, the definitive values of the two refractive indexes of the media in contact at the decoupling surface are those they assume at the point of incidence concerned.

To increase decoupling, the angle $$\theta_c = \arcsin\frac{n_2}{n_1} + \varepsilon$$

can also be taken as the total reflection angle, where $\varepsilon$ denotes a correction angle of between about 3° and 5°. This prevents the decoupling surface from being shaped so that light rays strike it at nearly the total reflection angle. In that case, even small production tolerances would result in total reflection.

Light rays that strike the decoupling surface at an angle larger than the total reflection angle $\theta_c$ are totally reflected. These rays are usually then absorbed or at least decoupled in an unintended direction.

According to the invention, therefore, a portion of the light rays strikes the decoupling surface in such a way that no total reflection occurs, the radiation power of these light rays collectively being greater than a predetermined fraction of the total radiation power that is preferably at least 50%. An advantageously high radiation efficiency is thereby achieved.

The optical element serves according to the invention to guide or shape the bundle of light rays emitted by the light source. Mere coatings applied to the light source do not constitute optical elements in this sense, since light rays pass through them largely unimpeded. This is particularly true of thin-walled coatings with a constant layer thickness.

In a preferred embodiment of the invention, the light source is a semiconductor body, for example an LED chip. Because its internal quantum efficiency is typically relatively high, a semiconductor body, when used as the light source, makes it possible to achieve a particularly high efficiency for the lighting device. In addition, optimum adaptation of the optical element becomes especially meaningful when a semiconductor body is used as the light source, because of its broader radiation characteristic.

In the context of the invention, "light" is to be understood both as visible light and as infrared or ultraviolet electromagnetic radiation, although a light source that emits visible light is preferred because of its many advantageous applications. For instance, the invention can be used in motor-vehicle lights or signal systems such as traffic lights or railroad signals. Such devices require very high light output, so a high-efficiency lighting device according to the invention is particularly advantageous.

For visible light, in the context of the invention the total radiation power or the radiation power of the light rays can be replaced by the corresponding illumination engineering variable, the light flux. That being the case, therefore, the light flux of the light rays whose angle of incidence on the decoupling surface is smaller than the total reflection angle is collectively greater than a predetermined fraction of the total light flux of the light source that is preferably at least 50%.

In a further advantageous embodiment of the invention, the light source is at least partially surrounded by the optical element. This arrangement facilitates the shaping of the decoupling surface. In this case, the optical element is preferably formed of an enveloping material for the light source, for instance a synthetic envelope. Advantageously, in this embodiment the optical element serves both for optimum decoupling of light and to protect the light source against damaging environmental influences. Such an envelope is expedient particularly in the case of semiconductor bodies, where it takes the form of a potting or molding compound in which the semiconductor body is embedded.

A reflector for the radiation generated by the light source is preferably provided according to the invention. This limits the solid angle relevant to the decoupling surface, thus making it easier to configure the decoupling surface as taught by the invention. In particular, radiation fractions that are not emitted in the direction of the decoupling surface can thus be reflected in the direction of the decoupling surface. More light rays in total therefore strike the decoupling surface, which corresponds to an increase in the efficiency of the lighting arrangement.

Suitable materials for the reflector, depending on the design and the field of use of the lighting device, are, for example, a thermoplast, a duroplast or a ceramic.

For example, when the light source is a semiconductor, a metal reflector can serve simultaneously as a heat sink and as an electrical connection. Thermoplast or duroplast reflectors can be made from an appropriate material in combination with a housing for the semiconductor body without special expenditure. A ceramic reflector, for example in the form of a suitably shaped ceramic sheet, can be placed in a prefabricated housing, under which circumstances it exhibits high mechanical strength.

In this embodiment of the invention, a reflector with a high reflection coefficient is advantageous for the light emitted by the light source. To this end, the reflector can be provided with a coating to increase its reflection coefficient. This coating can for example be implemented as a surface metallization or a dielectric coating. Even in the case of a metal reflector, which naturally has a metallically reflecting surface, a surface finish of this kind can effect an advantageous improvement in the reflection properties.

Moreover, a housing for the light source can also be fabricated from a ceramic. Ceramic housings are distinguished by a particularly high radiation resistance in the blue and ultraviolet regions of the spectrum. In this case the reflector is expediently implemented as part of the housing and optionally provided with one of the above-described coatings.

In an advantageous improvement of this embodiment of the invention, the reflector has a CPC (Compound Parabolic Concentrator) structure, which is particularly well suited for modeling luminescent surfaces. Such CPC structures are known per se and thus will not be described in greater detail.

BRIEF DESCRIPTION OF THE DRAWINGS

Additional features, advantages and expediencies of the invention will emerge from the following description of two exemplary embodiments in conjunction with FIGS. 1 to 4.

Therein.

Like or like-acting elements are provided with the same reference numerals in the figures.

DETAILED DESCRIPTION OF THE INVENTION

Figure 1:
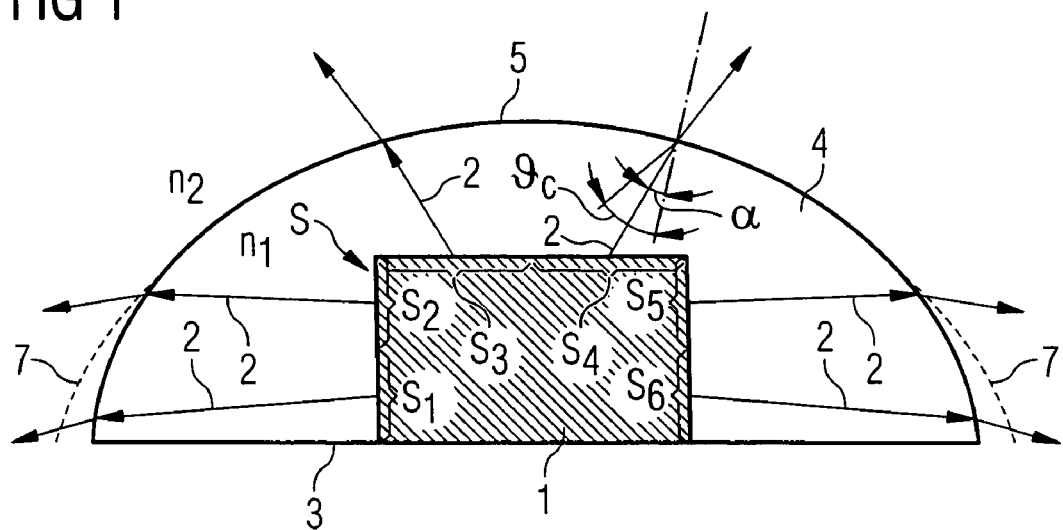
FIG. 1 is a schematic sectional view of a first exemplary embodiment of an inventive lighting device.

The lighting device depicted in FIG. 1, representing the first embodiment of the invention, comprises a light source 1 in the form of an LED chip that emits incoherent light with a total radiation power P. The radiation-emitting area S of light source 1 is divided into a plurality of subareas $S_1$ to $S_{20}$. Of these subareas, only subareas $S_1$ to $S_6$ are illustrated in FIG. 1, owing to the sectional view.

Figure 2:
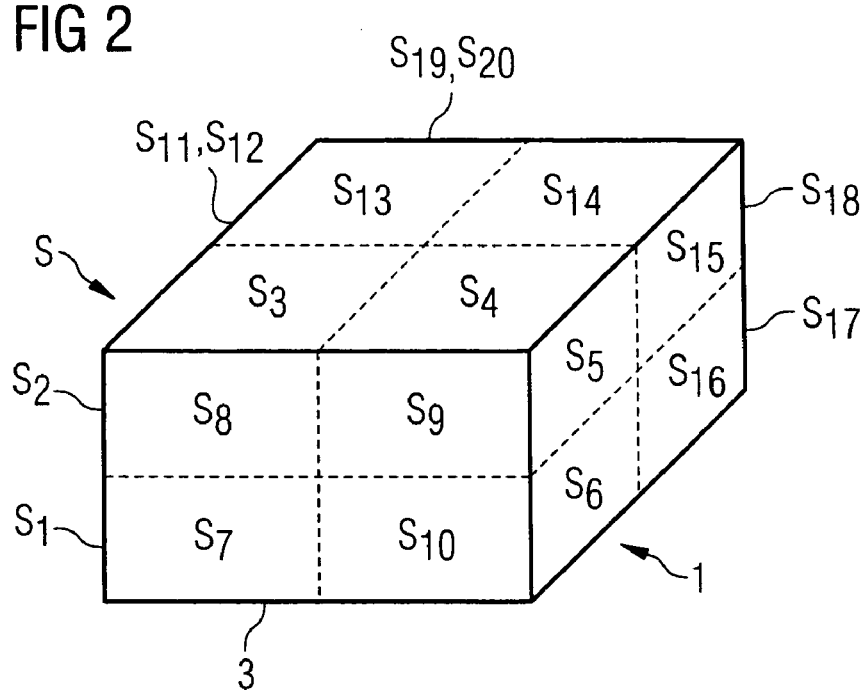
FIG. 2 is a schematic perspective concept view of the light source of the first exemplary embodiment of an inventive lighting device.

FIG. 2 shows a corresponding light source 1 in the form of an LED chip in perspective representation. The bottom face 3 serves as the mounting face of the LED chip and thus is not a radiation-emitting face. The other five side faces of the approximately cuboid light source make up the radiation-emitting area S of the light source. Each of these side faces is divided into four subareas, so radiation-emitting area S is therefore divided into a total of 20 subareas $S_1$ to $S_{20}$.

It should be noted that any other subdivision can also be carried out within the context of the invention. In particular, this subdivision need not be regular or be of the same kind for different side faces. For instance, it can be expedient to make a finer-meshed subdivision in the region of edges and corners in order to mirror the radiation characteristic in those regions more accurately.

In the exemplary embodiment depicted in FIG. 1, assigned to each subarea $S_i$ is a light ray 2 with a radiation power $P_i$. In this case, the sum of the radiation powers of all the light rays is equal to the total radiation power:

$$\sum_i P_i = P$$

The radiation power $P_i$ and the direction of the individual light rays depends on the specific properties of the light source. These can be determined for example experimentally, by measuring the spatial radiation characteristic of the light source. Alternatively, the radiation characteristic can also be determined from simulation calculations for the light source. For LED chips in particular, such simulations can be performed by ray-tracing methods, taking the geometric structure of the LED chip as a basis.

The exemplary embodiment depicted in FIG. 1 further comprises an optical element 4 having a decoupling surface 5. The optical element is formed from a potting compound in which light source 6 is embedded. The potting compound can, for example, be a synthetic material, preferably a reactive resin. Suitable for this purpose are, for example, epoxy resins, acrylic resins, silicone resins or mixtures of these resins.

The decoupling surface 5 of the optical element is shaped so that all light rays strike the decoupling surface at an angle α of incidence that is smaller than the total reflection angle $\theta_c$. For an optical element 4 with a refractive index $n_1$ and an adjacent environment having a smaller refractive index $n_2$, the total reflection angle is given by $$\theta_c = \arcsin\frac{n_2}{n_1} \text{ or } \theta_c = \arcsin\frac{n_2}{n_1} + \varepsilon,$$

where $\varepsilon$, again, denotes the above-cited correction angle. The angle of incidence and the total reflection angle are referred to the surface normal of the decoupling surface 5 at the incident point of the light ray 2 concerned.

The exemplary embodiment depicted in FIG. 1 constitutes a preferred arrangement of the invention, in which total reflection does not occur for any of the light rays under consideration. However, it is sufficient in the context of the invention if total reflection does not occur for a portion of the light rays, the radiation power of these light rays collectively being greater than a predetermined fraction of the total radiation power P that is preferably at least 50%.

An inventive decoupling surface can, for example, be found by starting with a known, roughly spherical decoupling surface and then varying the curvature of that surface in subregions until no further total reflection occurs for a portion of the light rays, the radiation power of these light rays collectively being greater than the predetermined fraction of total radiation power P. Known computer-aided variation and optimization methods are suitable for this purpose. The decoupling surface used as the point of departure is preferably first analyzed to determine which regions exhibit an increased amount of total reflection, and the curvature in these regions is then varied.

Figure 3:
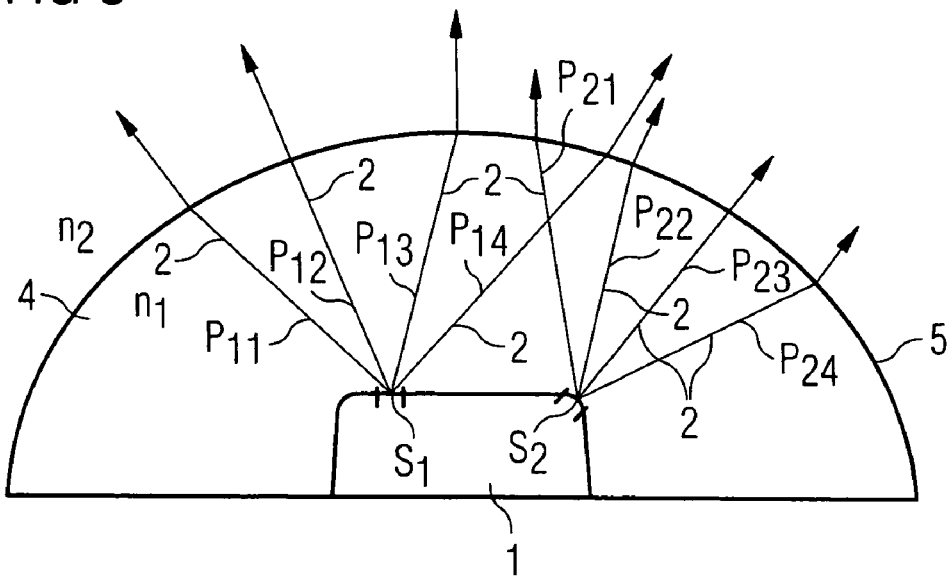
FIG. 3 is a schematic sectional view of a second exemplary embodiment of an inventive lighting device.

FIG. 3 is a schematic sectional view of a second exemplary embodiment of the invention based on the second mode of implementation. The depicted lighting device, like the previously described first exemplary embodiment, includes a light source 1 and an optical element 4 having a decoupling surface 5, the radiation-emitting surface of light source 1 being divided into a plurality of subareas $S_i$ (illustrated by way of example as two subareas $S_1$ and $S_2$). In contrast to the first exemplary embodiment, assigned to each subarea is, not a light ray, but a light ray bundle comprising a plurality of light rays 2. The total radiation power P of the light source is equal to twice the sum of all the radiation powers $P_{ij}$ of the light rays, this sum being taken over all the light rays of a given subarea $S_i$ and over all the subareas $S_i$:

$$\sum_j \sum_i P_{ij} = P$$

This additional assignment of a plurality of light rays to each subarea $S_i$ makes it possible to consider the radiation characteristics of the subareas by choosing the distribution of the radiation powers $P_{ij}$ on the basis of the radiation characteristic concerned.

This means, for example, that a bundle of light rays is assigned to a subarea $S_i$ from which radiation is emitted in different directions ê with different intensities $I_i(ê)$, the radiation power $P_{ij}$ of a light ray having a direction ê being expressed by:

$$P_{ij} = kI_i(ê),$$

in which k is a proportionality factor. This proportionality factor k can, for example, be selected so that the sum of all the radiation powers $P_{ij}$ of a subarea $S_i$ is equal to the intensity integrated over all spatial directions:

$$\sum_j P_{ij} = \int I_i(ê)d\Omega.$$

In this case, the decoupling surface 5 of the optical element is shaped so that at least for a portion of the light rays 2, the angle α of incidence on decoupling surface 5 is smaller than the total reflection angle $\theta_c$, and the radiation power of these light rays collectively is greater than a predetermined fraction q of the total radation power P that is preferably at least 50%.

For an optical element 4 with a refractive index $n_1$ and an adjacent environment with a smaller refractive index $n_2$, the total reflection angle is given by $$\theta_c = \arcsin\frac{n_2}{n_1} \text{ or } \theta_c = \arcsin\frac{n_2}{n_1} + \varepsilon,$$

where $\varepsilon$ again denotes the above-cited correction angle. The angle of incidence and the total reflection angle are again each referred to the surface normal of the decoupling surface 5 at the point of incidence of the light ray 2 concerned.

Figure 4:
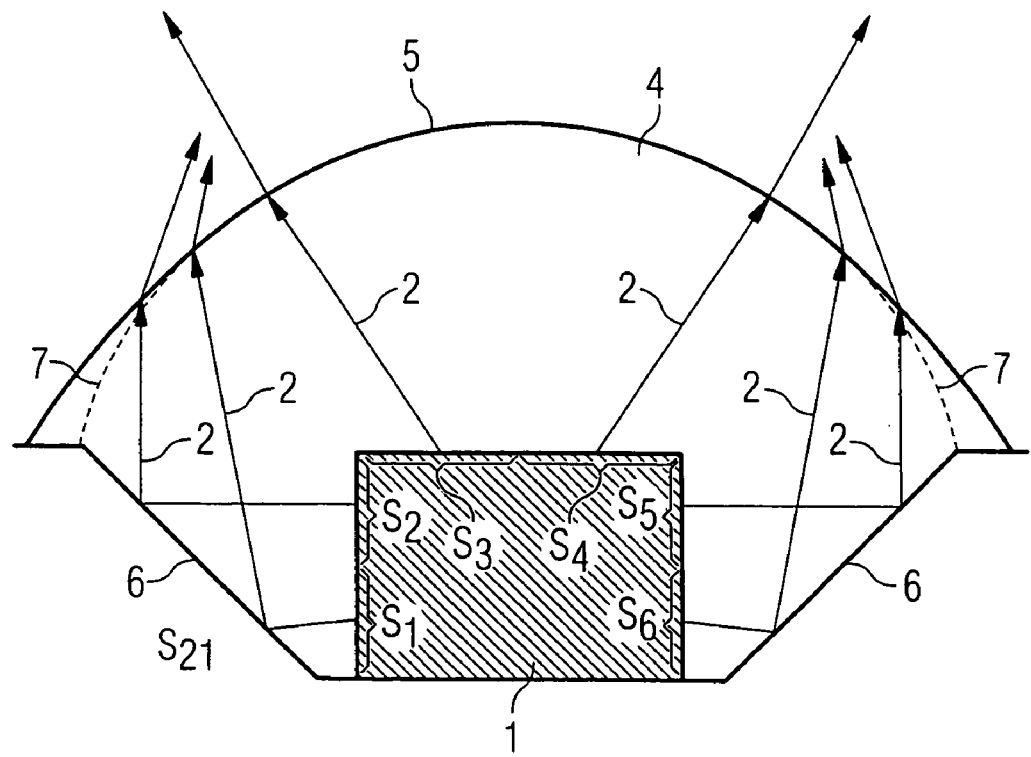
FIG. 4 is a schematic sectional view of a third exemplary embodiment of an inventive lighting device.

FIG. 4 shows a third exemplary embodiment of an inventive lighting device, based on the first mode of implementation. The light source 1, the subdivision of the radiation-emitting area S into subareas $S_i$ and the assignment of the light rays 3 are substantially the same as in the first exemplary embodiment, depicted in FIGS. 1 and 2.

In the second exemplary embodiment, a reflector 6 is additionally provided. This reflector 6 deflects the laterally emitted portions of the radiation, thereby limiting the solid angle relevant to the decoupling surface. This advantageously reduces the size and consequently the spatial requirements of the decoupling surface. It is also easier to shape the exit surface, owing to the more highly directed emission.

As in the first exemplary embodiment, the decoupling surface is shaped so that no total reflection of the light rays under consideration occurs, it being sufficient in the context of the invention if no total reflection occurs for a portion of the light rays and the radiation power of these light rays collectively is at least 50% of the total radiation power P.

Reflector 6 can be fabricated as part of a duroplast or thermoplast housing. Alternatively, the reflector can be implemented as a metal or ceramic insert for a prefabricated housing. Reflector 6 is preferably given a coating that increases the reflection coefficient for the radiation emitted by light source 1. This can, for example, be a surface metallization or a dielectric coating.

Figure 5:
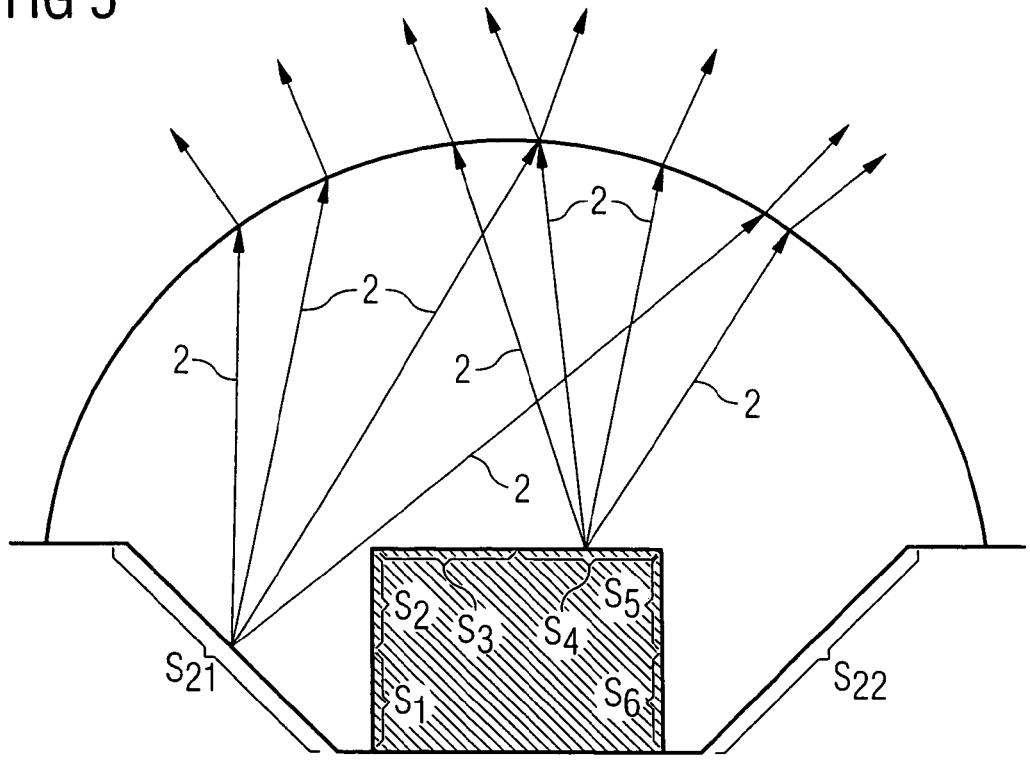
FIG. 5 is a schematic sectional view of a fourth exemplary embodiment of an inventive lighting device.

FIG. 5 shows a fourth exemplary embodiment of an inventive lighting device, based on the second mode of implementation. The light source 1, the subdivision of the radiation-emitting area S into subareas $S_i$, the assignment of the light rays 3 and the reflector 6 itself are substantially the same as in the third exemplary embodiment depicted in FIG. 4.

However, as in the second exemplary embodiment, illustrated in FIG. 3, a bundle of plural light rays is assigned to each subarea $S_i$. In addition, reflector 6, which can reflect at least partially diffusely, is brought into this scheme and its surface is also divided into subareas $S_i$. Thus, according to the invention a reflector can also be considered part of the light source.

Decoupling surface 5 is shaped so that no total reflection occurs for a portion of the light rays and the radiation power of these light rays collectively is greater than a predetermined fraction of the total radiation power, said proportion preferably being 50%.

Figure 6:
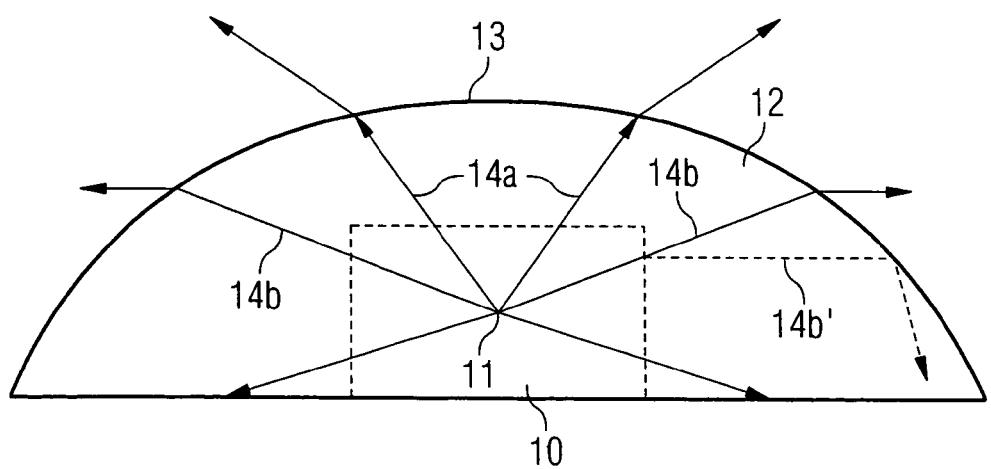
FIG. 6 is a schematic sectional view of a lighting device according to the prior art.

FIG. 6 shows a lighting device of prior art for purposes of comparison. This lighting device includes a light source 10, which is approximated to a point light source with a center 11 in the middle of the light source. The light source is embedded in an optical element 12 with a spherical decoupling surface 13.

In the vicinity of the point light source, the light rays 14a and 14b strike the decoupling surface at an angle that is smaller than the total reflection angle. However, this approximation is poorly satisfied for the laterally emitted light rays 14b, as a comparison with FIG. 1 shows. In particular, as evidenced by light ray 14b' drawn in for purposes of comparison, these light rays actually strike decoupling surface 13 much more shallowly and are totally reflected there. In the aggregate, therefore, considerable reflection losses can occur with a decoupling surface that has been shaped on the basis of conventional approximations and thus has a high coupling factor.

According to the invention, by contrast, as FIG. 1 shows, the decoupling surface is optimized so that the laterally emitted light rays are decoupled as well. To this end, in deviation from the spherical shape, in the exemplary embodiment of FIG. 1 the curvature of the decoupling surface 5 is modified in the edge regions so that the incident angle of the laterally emitted light rays is smaller than the total reflection angle. With the spherical shape 7 of prior art (illustrated in dashed lines for purposes of comparison), the incident angle of the laterally emitted light rays is much greater and total reflection losses can therefore occur.

In the exemplary embodiment depicted in FIGS. 2 and 3, on the other hand, the curvature of the decoupling surface 5 is modified in the edge regions so as to reduce the loss due to total reflection for the light rays deflected by reflector 6 or emanating from reflector 6. Here again, the spherical shape 7 of prior art (included in dashed lines for purposes of comparison) would lead to total reflection losses.

The invention is not limited by the description with reference to the exemplary embodiments. In particular, the invention relates to any light sources, which need not necessarily contain a semiconductor chip. The light source can also comprise plural components, such as, for example, an LED chip and an envelope for wavelength conversion, of the kind used to produce mixed-color and, in particular, white light. Moreover, the light source can itself be a lighting device according to the instant invention.

The invention encompasses any novel feature and any combination of features, particularly including any combination of the features recited in the claims, even if that combination is not mentioned explicitly in the claims.

What is claimed is:

1. A lighting device comprising a light source that emits incoherent light rays from at least one light emitting surface, and an optical element disposed after the light source and comprising a light exit surface and at least one reflector configured to reflect light rays emitted from the at least one light emitting surface in the direction of the light exit surface,
   wherein the light exit surface is arc-shaped in cross-section, the arc-shaped cross-sectional surface comprising two end points and an apex between the end points, and
   wherein a curvature of the light exit surface at the apex is spherical, and a curvature of the light exit surface at points corresponding to the curvature portion that is below each of the end points is less than spherical to reduce total internal reflection of light rays that are reflected by the at least one reflector,
   wherein the cross-sectional shape of the light exit surface is free of kinks over its entire length, and
   wherein the light source is a semiconductor body embedded in the optical element such that the semiconductor body is in direct contact with the optical element.

2. The lighting device of claim 1, wherein the light exit surface is shaped so that for at least a portion of the light rays, an angle of incidence on the light exit surface is smaller than a total reflection angle, and the radiation power of the portion of light rays is at least 50% of a total radiation power emitted by the light source.

3. The lighting device of claim 1, wherein the light rays comprise visible light.

4. The lighting device of claim 1, wherein the light source is at least partially surrounded by the optical element.

5. The lighting device of claim 1, wherein the at least one reflector comprises a metal or is provided with a metallized surface.

6. The lighting device of claim 1, wherein the at least one reflector comprises a reflector body formed of a first material, and a coating formed of a second material having a higher reflectivity than the first material.

7. The lighting device of claim 1, wherein the at least one reflector has a compound parabolic concentrator structure.

8. The lighting device of claim 4, wherein the optical element is formed from an enveloping material for the light source.

9. The lighting device of claim 8, wherein the enveloping material is a synthetic material.

10. The lighting device of claim 9, wherein the enveloping material is a reactive resin.

11. The lighting device of claim 5, wherein the at least one reflector comprises a duroplast.

12. The lighting device of claim 5, wherein the at least one reflector comprises a thermoplast.

13. The lighting device of claim 5, wherein the at least one reflector comprises a ceramic material.

* * * * *